United States Patent
Tenmei et al.

(10) Patent No.: US 7,618,847 B2
(45) Date of Patent: Nov. 17, 2009

(54) BONDING METHOD OF SEMICONDUCTOR AND LAMINATED STRUCTURE FABRICATED THEREBY

(75) Inventors: Hiroyuki Tenmei, Odawara (JP); Kunihiko Nishi, Kokubunji (JP); Yasuhiro Naka, Hitachinaka (JP); Nae Hisano, Matsudo (JP); Hiroaki Ikeda, Hachioji (JP); Masakazu Ishino, Yokohama (JP)

(73) Assignees: Elpida Memory, Inc., Tokyo (JP); Hitachi, Ltd., Tokyo (JP)

( * ) Notice: Subject to any disclaimer, the term of this patent is extended or adjusted under 35 U.S.C. 154(b) by 0 days.

(21) Appl. No.: 12/187,622

(22) Filed: Aug. 7, 2008

(65) Prior Publication Data

US 2009/0072414 A1 Mar. 19, 2009

(30) Foreign Application Priority Data

Aug. 14, 2007 (JP) ............................. 2007-211219

(51) Int. Cl.
H01L 21/00 (2006.01)
(52) U.S. Cl. ...................... 438/118; 438/107; 438/113; 257/E21.499; 257/E21.508; 257/E21.519
(58) Field of Classification Search ............ 257/E21.48, 257/E21.512
See application file for complete search history.

(56) References Cited

U.S. PATENT DOCUMENTS 7,109,060 B2 9/2006 Fukazawa
2004/0207082 A1 10/2004 Yamano et al.
2005/0136568 A1 6/2005 Fukazawa
2007/0048902 A1* 3/2007 Hiatt et al. ................... 438/108
2008/0122117 A1* 5/2008 Pendse ........................ 257/778

FOREIGN PATENT DOCUMENTS

| EP | 1686623 A1 | 8/2006 |
| JP | 2003-249620 | 9/2003 |
| JP | 2004-319707 | 11/2004 |
| JP | 2005-136187 | 5/2005 |
| JP | 2005-183580 | 7/2005 |
| JP | 2005-302858 | 10/2005 |
| JP | 2006-100656 | 4/2006 |

* cited by examiner

*Primary Examiner*—Savitri Mulpuri
*Assistant Examiner*—Cheung Lee
(74) *Attorney, Agent, or Firm*—Mattingly & Malur, P.C.

(57) ABSTRACT

A bonding method (three-dimensional mounting) of semiconductor substrates is provided to sequentially bond a principal surface of a silicon wafer on which coupling bumps are formed, and a principal surface of the other silicon wafer on which pads are formed, by an adhesive applied to at least one of the principal surfaces. However, there is a problem of poor electrical coupling due to displacement of the bumps and the pads when bonded together. The present invention solves such a problem by conducting temporary positioning of the silicon wafers, adjusting the positions of the coupling bumps and pads while confirming the positions by a method such as x-ray capable of passing through the silicon wafers, and bonding the bumps and the pads together while hardening an interlayer adhesive provided between the principal surfaces of the silicon wafers by thermocompression.

10 Claims, 11 Drawing Sheets

ARRANGEMENT OF ALIGNMENT MARK(S) FOR X-RAY DETECTION

FIG. 1

THREE-DIMENSIONAL MOUNTING PROCESS (NO. 1)

(1)

FORMING HOLES, FORMING AN INSULATING FILM ON AN INNER WALL OF EACH OF THE HOLES, AND FILLING EACH OF THE HOLES WITH CONDUCTIVE MATERIAL(S)

(2)

DEVICE FABRICATION USING SEMICONDUCTOR WAFER PROCESS (FRONT-END PROCESS)

(3)

FORMING FINE BUMPS

FIG. 2

THREE-DIMENSIONAL MOUNTING PROCESS (NO. 2)

(4)

LAMINATION
(STACKING AND FIXING THE INTERPOSER ON A SURFACE OF THE SEMICONDUCTOR WAFER (THE FINE BUMPS) BY THERMOCOMPRESSION OR ULTRASONIC WAVE)

(5)

POLISHING ANOTHER PRINCIPAL SURFACE OF THE SEMICONDUCTOR WAFER AND FORMING BONDING ELECTRODES THEREON

(6)

LAMINATION
(STACKING AND FIXING SECOND SEMICONDUCTOR WAFER ON THE ANOTHER SURFACE OF THE SEMICONDUCTOR WAFER (THE BONDING ELECTRODES) BY THERMOCOMPRESSION OR ULTRASONIC WAVE)

FIG. 3

THREE-DIMENSIONAL MOUNTING PROCESS (NO. 3)

(7)

POLISHING ANOTHER PRINCIPAL SURFACE OF THE SECOND SEMICONDUCTOR WAFER AND FORMING BONDING ELECTRODES THEREON

(8)

ASSEMBLING LAMINATED STRUCTURE (THREE-DIMENSIONAL LAMINATED STRUCTURE) ACCORDING TO THE PRESENT INVENTION

FIG. 4

PROCESS FOR FORMING BUMP(S) (NO. 1)

PROCESS FOR FORMING BUMP(S) (NO. 2)

PROCESS FOR FORMING PAD(S) (NO. 1)

FIG. 7

PROCESS FOR FORMING PAD(S) (NO. 2)

PROCESS FOR BONDING SEMICONDUCTOR WAFERS (NO. 1)

(1)

MOUNTING SEMICONDUCTOR WAFER TO JIG (2)

APPLYING INTERLAYER ADHESIVE
(ON THE SEMICONDUCTOR WAFER)

(3)

POSITIONAL ADJUSTMENT

FIG. 9

PROCESS FOR BONDING SEMICONDUCTOR WAFERS (NO. 2)

(4) TEMPORARY POSITIONING

(5) POSITIONAL CONFIRMATION

(6) POSITIONAL ADJUSTMENT

FIG. 10

PROCESS FOR BONDING SEMICONDUCTOR WAFERS (NO. 3)

(7)

APPLYING AND CURING (HARDENING) ADHESIVE (8)

MOVING THE STACKED SEMICONDUCTOR WAFERS
TO HEATING (HOT) PLATE, AND HEATING THEM THEREBY (9)

REMOVING THE STACKED SEMICONDUCTOR
WAFERS FROM THE HEATING PLATE

BONDING METHOD OF SEMICONDUCTOR AND LAMINATED STRUCTURE FABRICATED THEREBY

CLAIM OF PRIORITY

The present application claims priority from Japanese Patent Application JP 2007-211219 filed on Aug. 14, 2007, the content of which is hereby incorporated by reference into this application.

BACKGROUND OF THE INVENTION

1. Field of the Invention

The present invention relates to a bonding method of semiconductor substrates to perform three-dimensional mounting by bonding plural semiconductor substrates through an interlayer adhesive, and to a laminated structure fabricated thereby.

2. Description of the Related Art

A reduction in the thickness and size of electronic devices has been achieved by miniaturizing the components mounted thereon. The miniaturization of electronic devices has been largely dependent on the fine processing technology of LSI. However, introduction of more advanced fine processing technology into the LSI process requires significant capital investment, which is against the need for product cost reduction. In order to solve this technical problem, there has been developed a technology of mounting in a three-dimensional direction (three-dimensional mounting), instead of mounting in a plane direction (two-dimensional mounting) as in the past. This is accomplished by forming through-hole electrodes in a direction perpendicular to a surface of a silicon wafer, forming electrodes on the front and back surfaces of the silicon wafer, and electrically coupling the electrodes together to laminate the silicon wafer.

There have been proposed processes for forming a semiconductor device by three-dimensional lamination in JP-A No. 136187/2005 and its counterpart European Patent Application Publication: EP 1686623 A1, and in JP-A No. 183580/2005 and its counterpart United States Patent Application Publication No. US 2005/0136568 A1 and the registered U.S. Pat. No. 7,109,060 thereof. However, in the above cited documents, there is no detailed description with respect to the lamination about whether wafers are simultaneously laminated, or the wafers are cut into individual chips before being laminated.

The following processes are proposed as a method for simultaneously laminating wafers.

In JP-A No. 319707/2004 and its counterpart United States Patent Application Publication: No. US 2004/0207082 A1, there is provided a process for simultaneously fabricating plural semiconductor packages at wafer level, followed by cutting into individual semiconductor packages. The semiconductor package has a laminated structure in which two or more semiconductor devices are bonded together through an insulation layer. The semiconductor devices, each including a substrate and device patterns formed on a surface thereof, are laminated in such a manner that the device pattern surface of the lower semiconductor device faces the non-device pattern surface of the upper semiconductor device.

In JP-A No. 302858/2005, there is provided a process for coupling electrodes of two different wafers by superimposing the wafers on one another. This process has a problem of being unable to bring all electrodes on one wafer, into contact with corresponding electrodes on the other wafer, due to wafer deformation caused by foreign material on a wafer holder or due to irregularities although there is no foreign material. In order to solve such a problem, a wafer holding surface of the wafer holder is divided into plural holding areas, to control the force of sucking a wafer as well as the force of pressing the wafer against the other wafer independently in each of the holding areas. In this way, it is possible to suck a wafer in one holding area, while pressing the wafer against the other wafer in another holding area. Thus, a uniform bonding can be obtained regardless of wafer surface irregularities.

In JP-A No. 100656/2006, there is provided a process for fabricating a lamination-type semiconductor device by laminating wafers, in which marks on the wafers to be superimposed on one another are detected to align between the wafers. At this time, when the wafer having been laminated is observed, plural alignment marks come into sight on the wafer, and the detection accuracy decreases. This leads to a decrease of alignment accuracy, resulting in a low production yield of lamination-type semiconductor devices. Thus, it is desired to form alignment marks being spaced apart at a predetermined distance on the wafers adjacent to each other when laminated. In this way, even when plural alignment marks come into sight, the alignment marks can be easily separated from each other.

In JP-A No. 249620/2003, there is provided a bonding method of semiconductor, and a laminated semiconductor fabricated by the method that prevents undesirable behavior of surface coating resin when bonding semiconductors, especially wafers, to ensure bonding of the metal electrodes, and preferably to ensure bonding of the entire surfaces to be bonded without forming void(s) therebetween at low temperature. More specifically, it is desired to bond semiconductors each having a surface on which electrodes are exposed, by filling resin between the electrodes of at least one of the semiconductors to form a resin layer on the surface thereof, projecting the electrodes of at least one of the specific semiconductors from the surface thereof, applying a pressure to the semiconductors with their electrodes brought into contact with each other to extend the contact portion of the electrodes, and bring the surface of the resin layer into contact with the surface of the other semiconductor.

SUMMARY OF THE INVENTION

The above described processes are proposed as a method for simultaneously laminating wafers. However, the following problems are left unsolved.

When silicon wafers are bonded by forming bonding bumps on one silicon wafer, forming pads on the other silicon wafer, and applying an adhesive between the wafer layers, displacement occurs between the silicon wafers when contacting each other. This leads to a displacement of the bumps and the pads, resulting in a lower yield.

According to an embodiment of the present invention, there is provided a technology that prevents displacement of the semiconductor substrates when bonded together, enabling the bumps and the pads to be properly bonded.

Typical embodiments of the present application will be briefly outlined below.

The present invention is a method for bonding semiconductor substrates. The method includes the following steps: first causing a surface of a first semiconductor substrate on which pads are formed, and a surface of a second semiconductor substrate on which bumps are formed, to come into contact with each other through an interlayer adhesive; second adjusting the positions of the first and second semiconductor substrates coming into contact with each other through the interlayer adhesive; third applying an adhesive to the periphery of the first and second semiconductor substrates whose positions have been adjusted in the second step, and hardening the adhesive applied to the periphery of the first and second semiconductor substrates; and fourth electrically coupling the pads and the bumps while hardening the interlayer adhesive, by heating and pressing the first and second semiconductor substrates having been subjected to the third step.

Further, the present invention is a laminated structure of semiconductor substrates fabricated by such a bonding method of semiconductor substrates.

According to the present invention, it is possible to bond bumps and pads of wafers when bonded by preventing displacement of the wafers.

BRIEF DESCRIPTION OF THE DRAWINGS

FIGS. 1-1 to 1-3 are diagrams of three-dimensional mounting process (No. 1);

FIGS. 2-4 to 2-6 are diagrams of the three-dimensional mounting process (No. 2);

FIGS. 3-7 and 3-8 are diagrams of the three-dimensional mounting process (No. 3);

FIGS. 4-1 to 4-3 are diagrams of a process for forming bump(s) (No. 1);

FIGS. 5-4 to 5-6 are diagrams of the process for forming bump(s) (No. 2);

FIGS. 6-1 to 6-3 are diagrams of a process for forming pad(s) (No. 1);

FIGS. 7-4 and 7-5 are diagrams of the process for forming pad(s) (No. 2);

FIGS. 8-1 to 8-3 are diagrams of a process for bonding semiconductor wafers (No. 1);

FIGS. 9-4 to 9-6 are diagrams of the process for bonding semiconductor wafers (No. 2);

FIGS. 10-7 to 10-9 are diagrams of the process for bonding semiconductor wafers (No. 3); and FIG. 11 is a diagram showing an arrangement of alignment mark(s) for X-ray detection.

DETAILED DESCRIPTION

Hereinafter, an embodiment of the present invention will be described with reference to accompanying drawings. Throughout all the drawings, like parts are referred to by like reference numerals and will not be described repeatedly. Further, the dimensional ratio of each component is different from the actual ratio for the sake of simplifying the explanation. In the following, the best mode for carrying out the invention will be described taking an example of three-dimensional mounting to which the present invention can be effectively applied.

According to an embodiment of the present invention, organic tin plating (pure tin or alloy containing 90% or more of tin) solder bumps formed on one wafer, and nickel (pure nickel or alloy containing 90% or more of nickel) pads formed on the other wafer, are bonded together. Further, according to the embodiment of the present invention, the solder bump has a diameter in a range of 10 to 100 µm, and a height in a range of 10 to 100 µm. In the following, a method for bonding silicon wafers will be described. However, the method can also be applied to large-size semiconductor substrates, for example, having plural areas for chips.

First, the outline of the three-dimensional mounting process will be described with reference to FIGS. 1 to 3.

Figure 1:
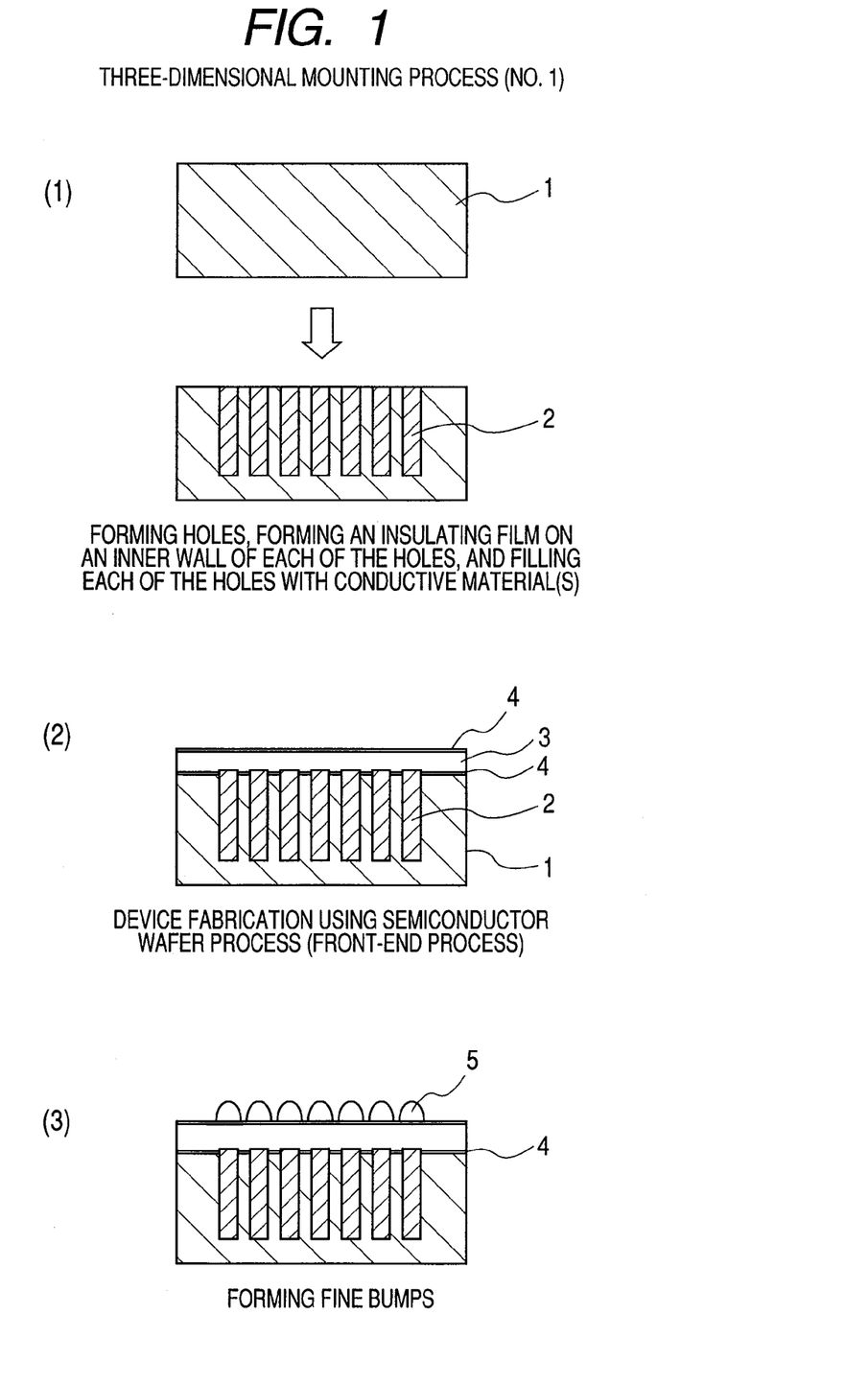
Figure 2:
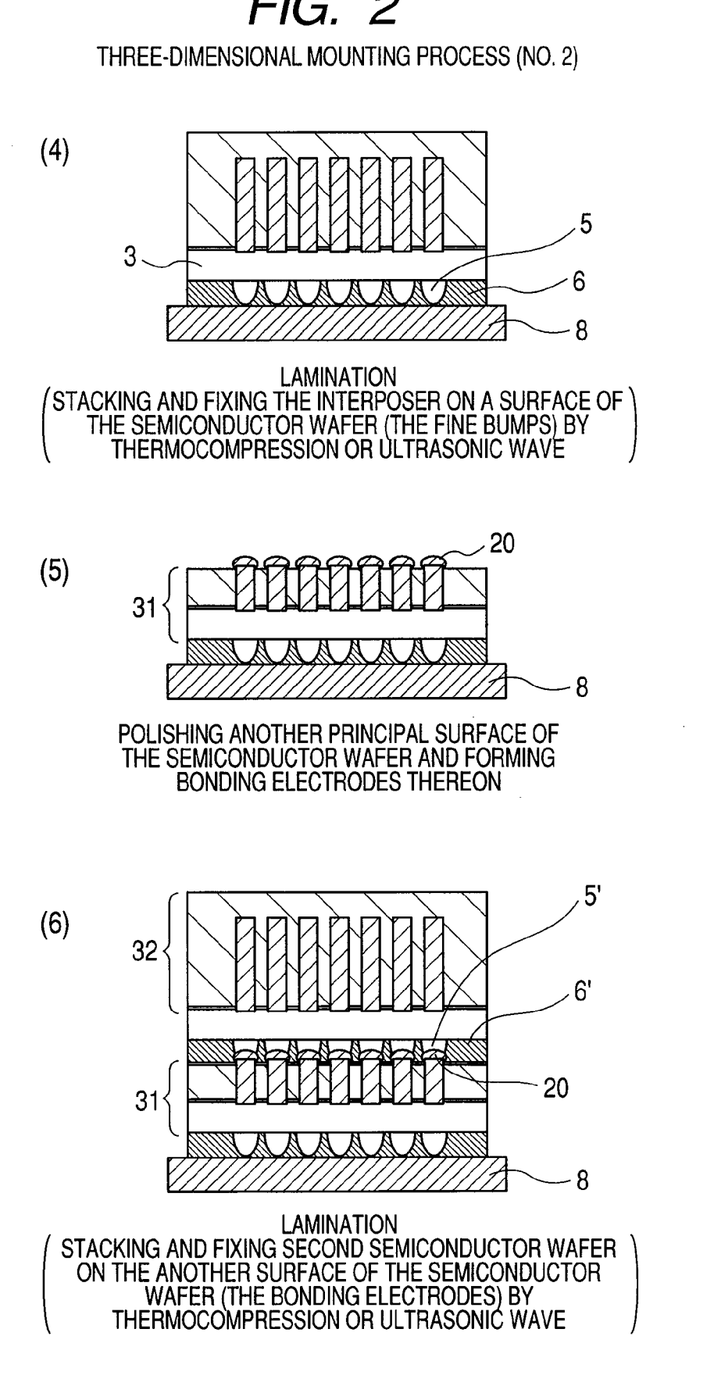
Figure 3:
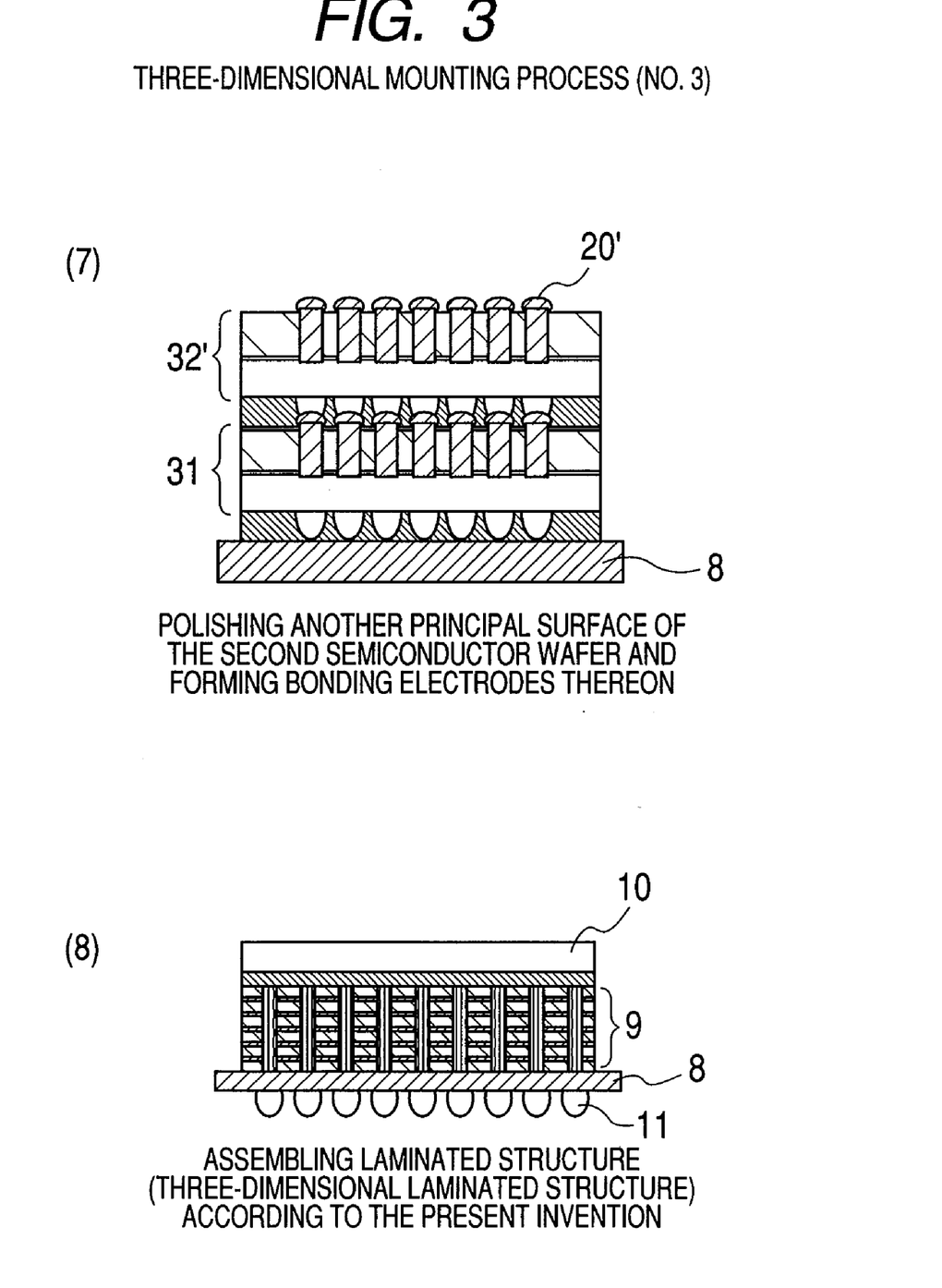
Figure 4:
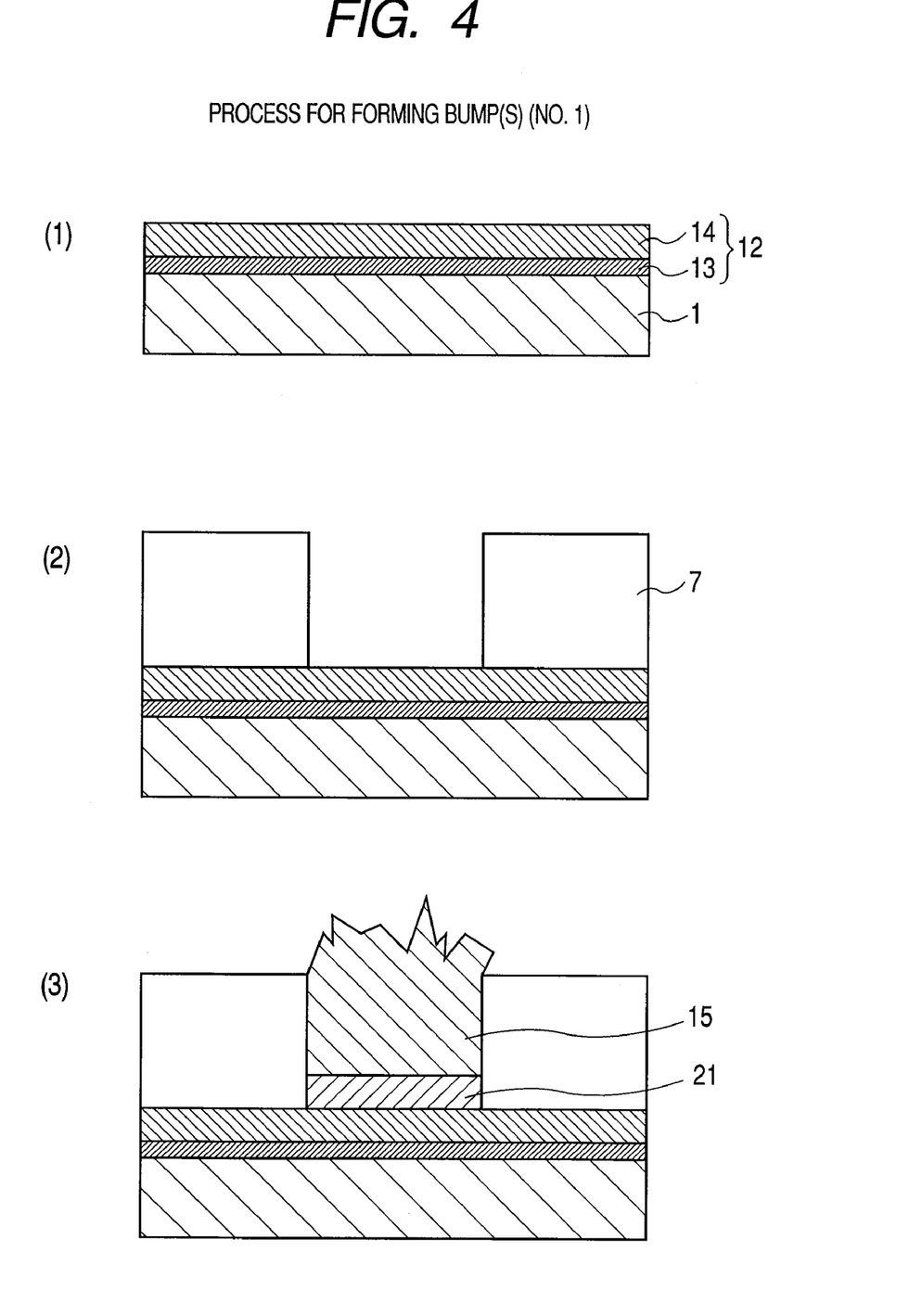
Figure 5:
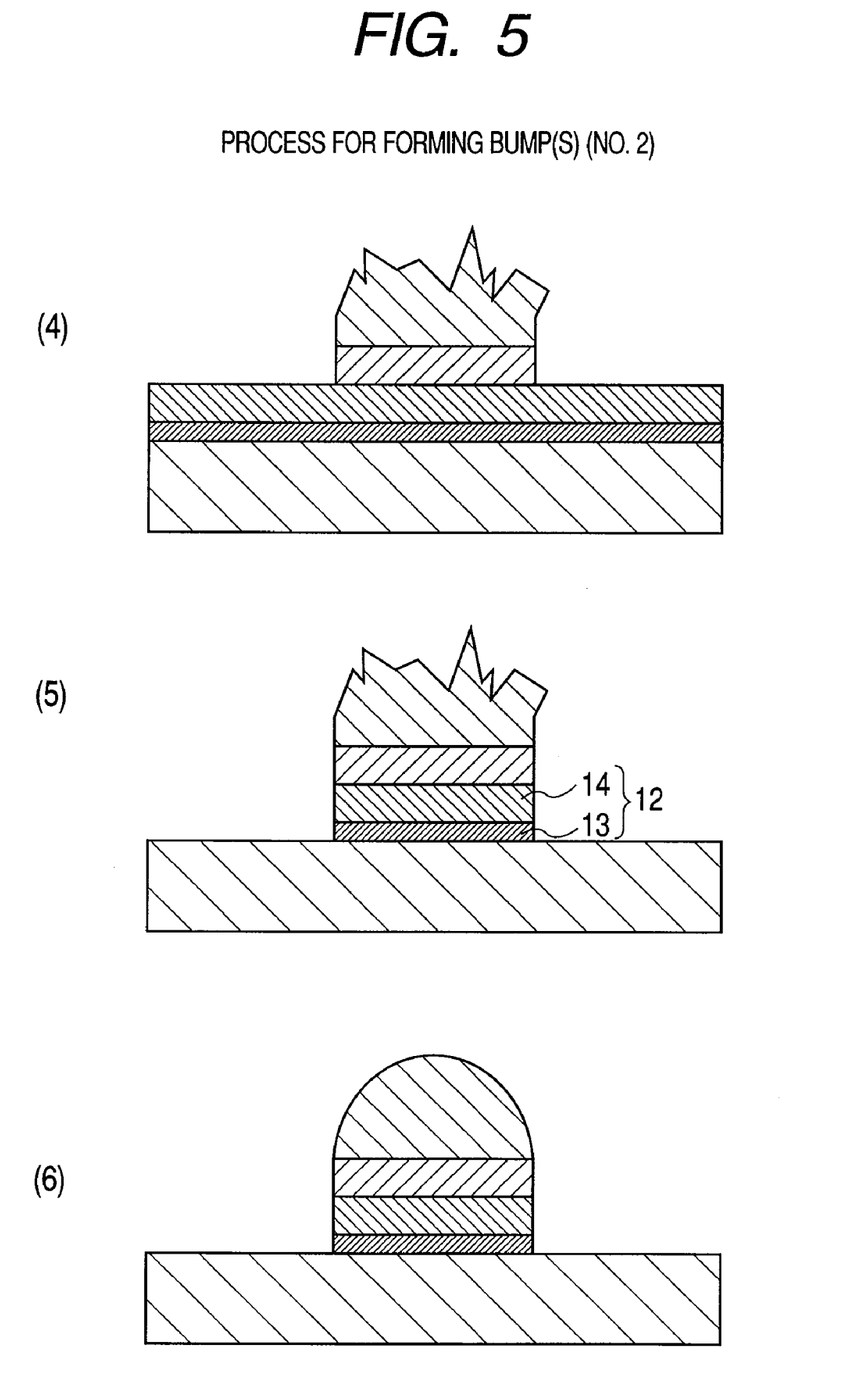
Figure 6:
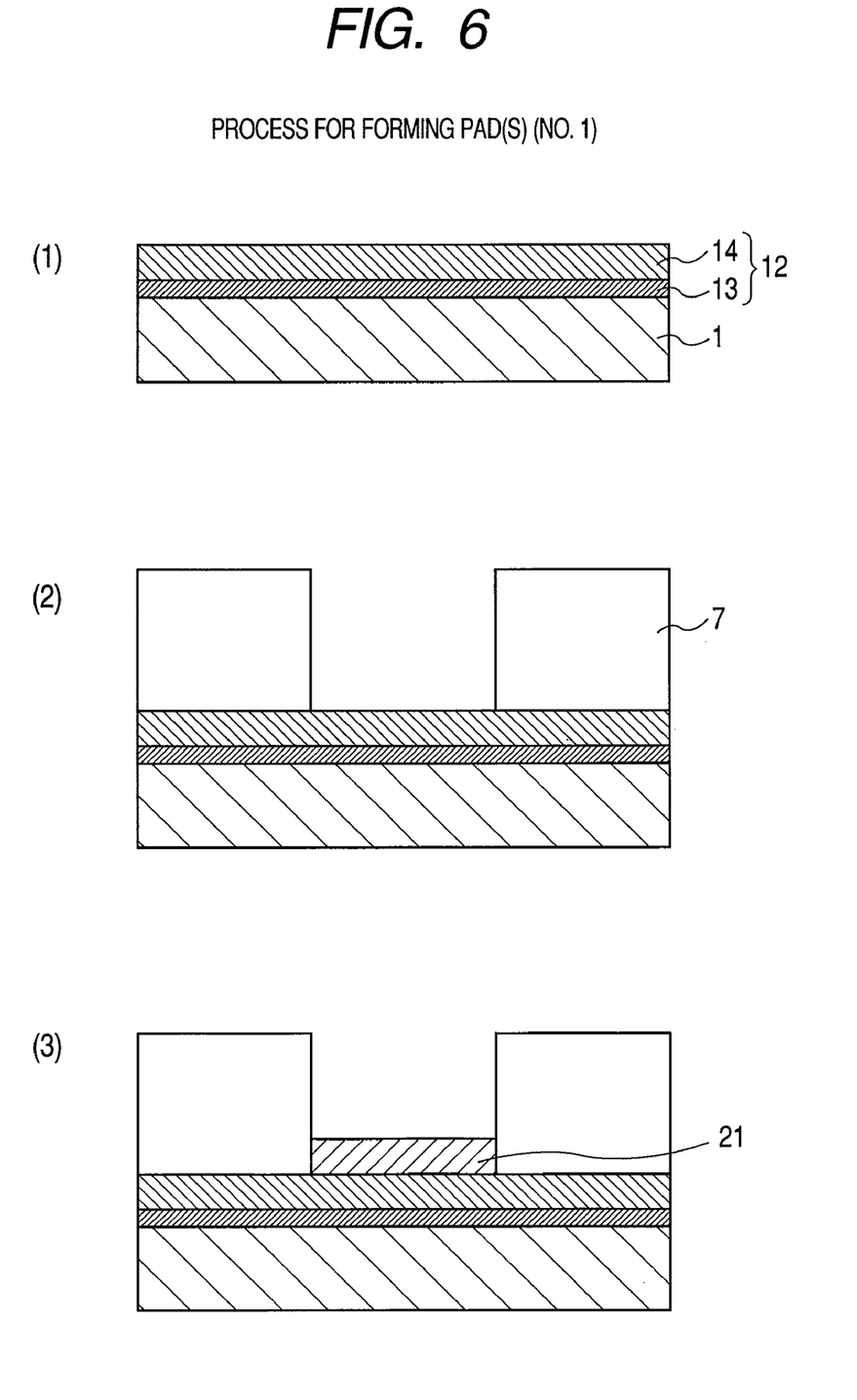
Figure 7:
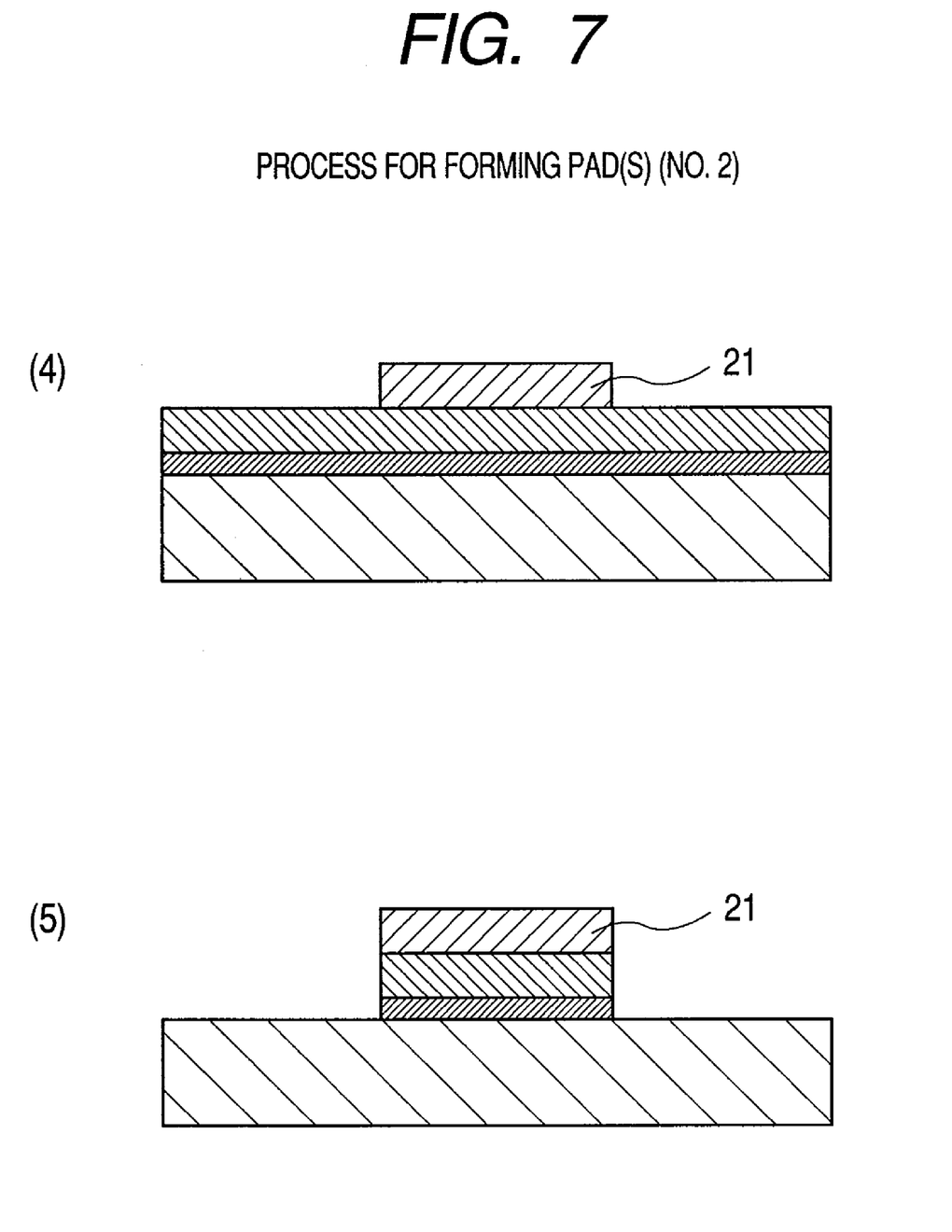
Figure 8:
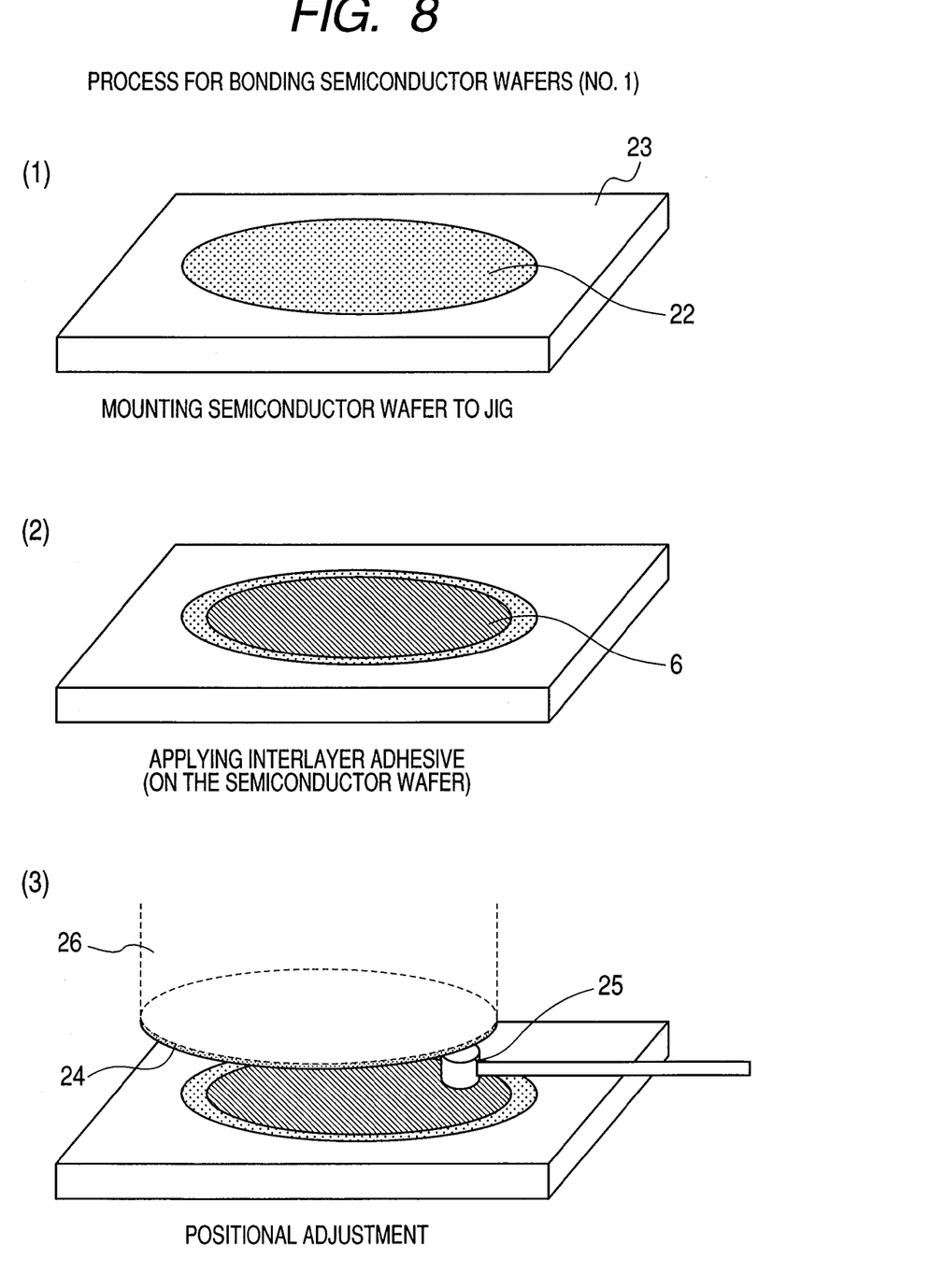
Figure 9:
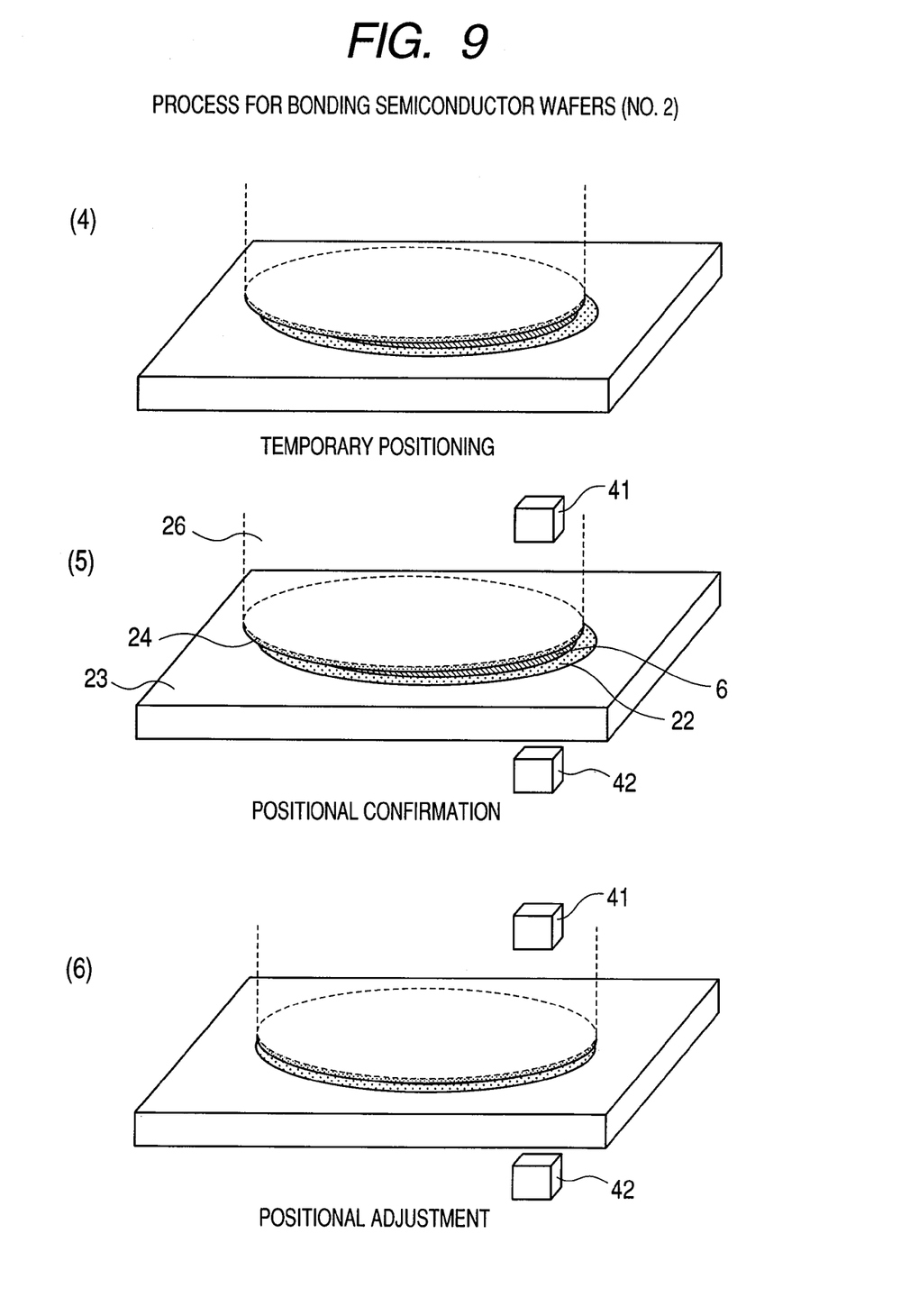
Figure 10:
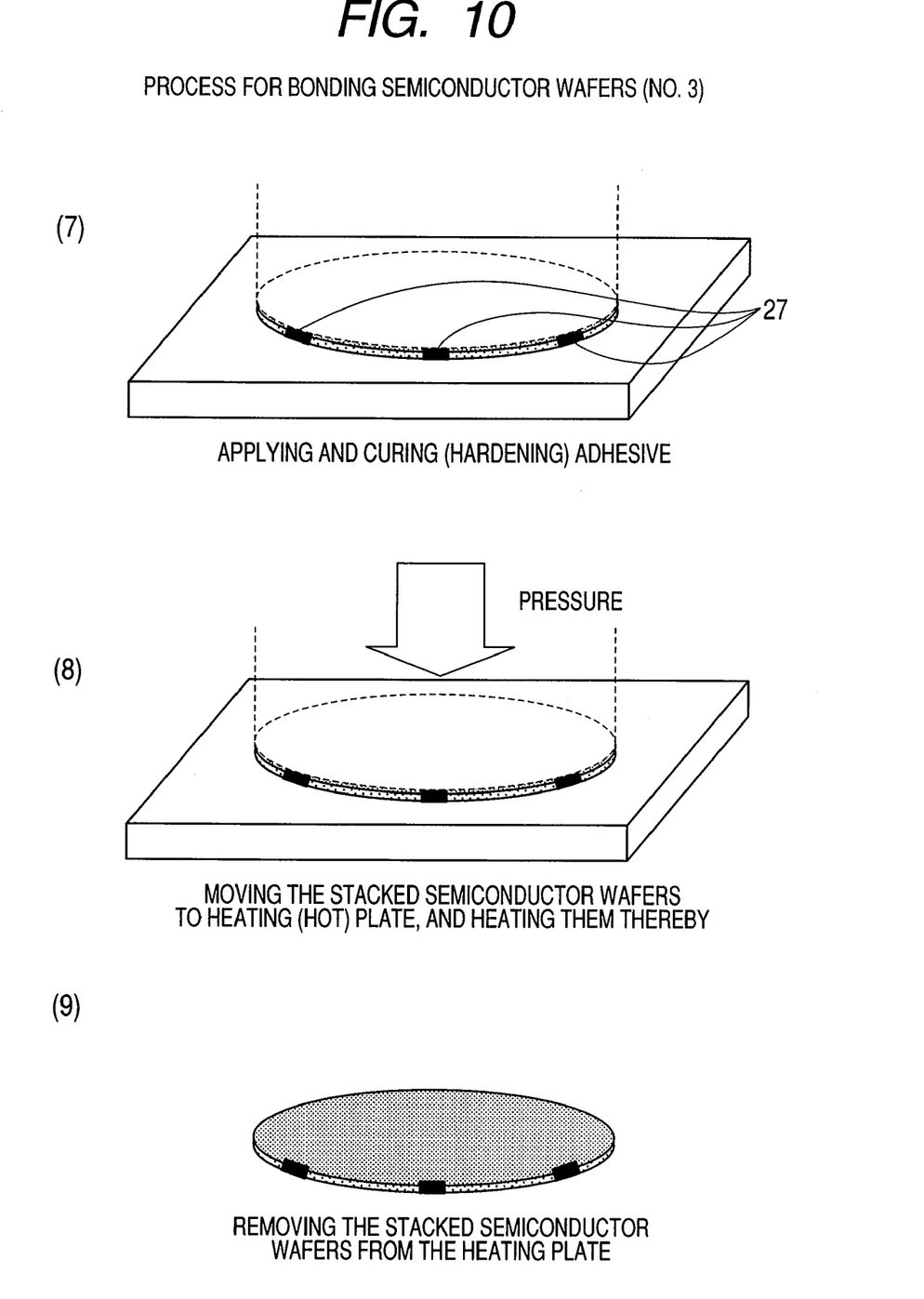
Figure 11:
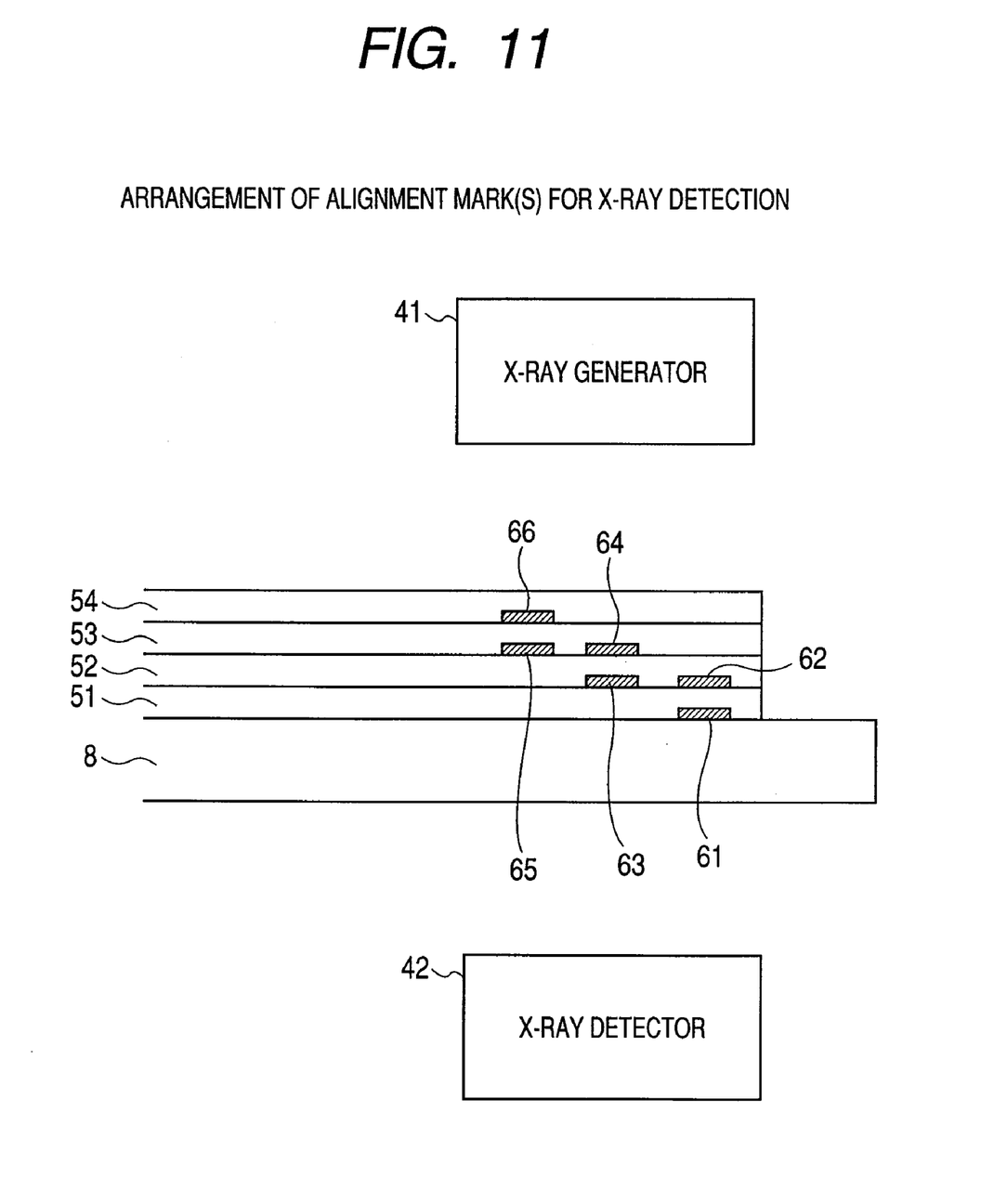

In FIG. 1-1, holes are formed in a silicon wafer 1 by a dry process. The side walls of each of the holes are insulated by thermal oxidation (this step is not shown in the figure). Then, each of the holes is filled with a conductive material of polysilicon (polycrystalline silicon) 2. The dimension here differs depending on the semiconductor wafer process (front-end process) and on the semiconductor elements to be fabricated. When assuming DRAM (Dynamic Random Access Memory), the polysilicon 2 has a diameter in the range of 20 to 30 µm, a depth in the range of 50 to 100 µm, and a pitch in the range of 40 to 100 µm. In this embodiment, polysilicon is used as the conductive material. It is also possible to use the following method including the steps of: current supply layer formation, electroplating, surface polishing, conductive film formation, catalyst addition, electroless plating, and surface polishing. However, in this case, there is a concern that metal ion (especially of copper) could penetrate from a portion in which silicon is exposed, which is unfavorable to the semiconductor process. Although not shown in the figure, it is preferable to seal the upper portions of polysilicon terminals with aluminum.

In FIG. 1-2, a semiconductor device layer 3 is formed on the surface of the silicon wafer 1 in which the polysilicons 2 are embedded, by a semiconductor wafer process (front-end process). An insulating film 4 is formed on the surface of the semiconductor device layer 3, except for the portions of the terminals of the polysilicons 2, using an inorganic material (finally, $SiO_2$ film) of TEOS (tetraethoxysilane) or an organic material such as polyimide, according to the necessity. Further, the insulating film 4 is also formed on the semiconductor element according to the necessity. Although not shown in particular, the terminal portions are opened by etching.

In FIG. 1-3, fine bumps 5 are formed. This step will be described in detail with reference to FIGS. 4 and 5.

In FIG. 2-4, an interlayer adhesive 6 is applied over the bumps 5 to laminate an interposer 8 and the silicon wafer. The interposer 8 and the silicon wafer are bonded, by electrically coupling pads (not shown) on the interposer 8 and the bumps 5 on the silicon wafer while hardening the interlayer adhesive 6 by thermocompression or ultrasonic wave. Incidentally, it is also possible to form pads on the silicon wafer and bumps on the interposer 8. Generally the interposer 8 is formed by silicon or resin. Here, the semiconductor element is formed on the interposer 8 as a mounted wafer. However, the process is the same for an element formed on another silicon wafer. The bonding method will be described in detail below with reference to FIGS. 8 to 10.

In FIG. 2-5, a surface of the silicon wafer 1 opposite to the surface thereof on which the semiconductor element 3 is formed, is polished to expose the polysilicon terminals. Then, fine pads 20 are formed on the surface in which the polysilicon terminals are exposed. Further details of this step will be described later with reference to FIGS. 6 and 7. This step provides a laminated structure in which a first wafer 31 is laminated on the interposer 8.

In FIG. 2-6, a second wafer 32 is laminated on the laminated structure obtained in the step 2-5 by laminating the first wafer 31 on the interposer 8, in a similar manner to the step of FIG. 2-4. The second wafer 32 is also formed by the steps of FIGS. 1-1 to 1-3. Reference numeral 5' denotes a bump formed on the second wafer. Reference numeral 6' denotes an interlayer adhesive provided between the first wafer 31 and the second wafer 32. The interlayer adhesive 6' is applied over the pads 20 of the first wafer 31 or over the bumps 5' of the second wafer 32, to laminate the second wafer 32 on the first wafer 31. The first wafer 31 and the second wafer 32 are bonded by electrically coupling the pads 20 on the first wafer 31 and the bumps 5' on the second wafer 32 while hardening the interlayer adhesive 6', by thermocompression or ultrasonic wave. Details of the bonding method will be described later with reference to FIGS. 8 to 10.

In FIG. 3-7, a surface of the second wafer 32, which is opposite to the surface thereof on which a semiconductor element is formed, is polished to expose the polysilicon terminals, in a similar manner to the step of FIG. 2-5. Then, fine pads 20' are formed on the surface in which the polysilicon terminals are exposed. Thus, a laminated structure in which the wafer 31 is bonded on the interposer 8 and a wafer 32' is further bonded on the wafer 31, is fabricated by the above described steps. The steps of FIG. 2-6 and FIG. 3-7 are repeated to fabricate a laminated structure in which a desired number of wafers are laminated.

FIG. 3-8 shows an overall view of a laminated semiconductor device according to the embodiment of the present invention. In FIG. 3-8, the semiconductor device includes a laminated structure 9 of six laminated wafers, interposer 8, and control chip 10. Incidentally, the control chip 10 is not necessarily provided on the top portion of the semiconductor device. The location of the control chip 10 is determined by taking into account the electrical characteristics and the size of the control chip 10, such as between any of the wafers in the laminated structure 9, or on the interposer 8. Bonding bumps 11 are formed on the interposer 8 to provide a semiconductor device having three-dimensional laminated structure.

Method for Forming Bump(s)

A method for forming the bump(s) shown in FIG. 1-3 will be described with reference to FIGS. 4 and 5.

In FIG. 4-1, titanium 13 and copper 14 were sputter deposited on the silicon wafer 1 to form a multi-layer film of titanium (50 nm)/copper (0.5 µm) as a sputter film. The function of the titanium here is to ensure bonding between the copper on the upper side of the titanium, and the wafer (which is the silicon wafer 1 in the figure, but an actual semiconductor element is formed by SiO2, SiN, or polyimide) on the lower side thereof. The thickness of the titanium film may be the minimum thickness at which the copper film and the wafer are kept bonded together. The desired film thickness varies depending on the sputter etching and sputtering conditions, characteristics of the titanium film, or other factors. Incidentally, the titanium film used in this embodiment can be replaced with another film such as chromium film, titanium/platinum film, or tungsten film.

While the thickness of the copper film is preferably the minimum thickness at which no film thickness distribution occurs in the subsequent tin electroplating step. Thus, the film thickness causing no film thickness distribution is determined by taking into account the loss of film thickness due to a pre-plating treatment such as acid cleaning. In the case in which the thickness of the copper film is greater then necessary, for example, when the copper film thickness exceeds 1 µm, the sputtering time increases and the production efficiency decreases. In addition, long-time etching is inevitable for removing the current supply layer 12 in the later step. As a result, the amount of side etching of the copper 14 under the titanium 15 is increased.

In FIG. 4-2, a fine bump pattern was formed using a resist 7. There is no restriction on the use of the resist, as long as it is resistant to tin electroplating without seriously damaging the tin electroplating when the resist is peeled off. In this embodiment, novolak-based positive resist was used. The documents say that tin is corroded by strong alkaline, so that it would not be possible to use a dry film using alkali as a peeling agent. However, according to experiments conducted by the present inventors, tin was not corroded when soaked in a 3% hydroxide solution at 45° C. for 3 minutes. This result demonstrates the possibility of using the dry film as a resist material. The resistance to alkali is related to the fact that the tin is not melted in a reflow process described later. In other words, it is thought that because the tin-electroplated surface covered with the oxide film, the tin is not melted by alkali.

In FIG. 4-3, tin 15 was precipitated on the pattern formed in the step of FIG. 4-2, by tin electroplating. In this embodiment, pure tin was used as a material for electroplating. However, a solder containing tin with minor amounts of silver or copper may also be used. The tin 15 can be directly formed on the copper, but preferably an underlying nickel 21 is formed.

In FIG. 5-4, the resist 7 formed in the step of FIG. 4-2 was peeled off. There is no restriction on the use of the peeling solution, as long as it is dissolved in the peeling solution to be used without affecting the tin electroplating. In this embodiment, an organic solvent (acetone or butyl acetate) was used as the peeling solution. Incidentally, because the tin electroplating is somewhat resistant to alkali as described above, it is also possible to use a 3% sodium hydroxide solution.

In FIG. 5-5, the current supply layer 12 formed in the step of FIG. 4-1 was removed by etching. There are a range of etching solutions such as ferric chloride and alkaline solution, which etch the copper 14. In this embodiment, an alkaline etching solution was used. An etching time of over 10 seconds makes it difficult to control the operation, and is unfavorable from the viewpoint of practice. On the other hand, when the etching time is too long, for example, when the etching is performed for 5 minutes or more, the amount of side etching is increased, leading to long takt time. In order to avoid such problems, the etching solution and etching conditions are preferably determined by appropriate experiments. The following etching of the portion of the titanium 13 of the current supply layer was performed using an etching solution containing hydrogen peroxide as a main component. In both etchings, there is no restriction on the use of the etching solution as long as the tin electroplating is not corroded by the etching solution to be used.

In FIG. 5-6, the tin electroplating is dissolved by heating at a temperature higher than the melting point of tin, to form a sphere.

Method for Forming Pad(s)

A method for forming the pad(s) shown in FIG. 2-5 and FIG. 3-7 will be described with reference to FIGS. 6 and 7. FIG. 6-1 is the same as FIG. 4-1.

In FIG. 6-2, a fine pad pattern was formed by the resist 7. There is no restriction on the use of the resist, as long as it is resistant to nickel electroplating without seriously damaging the nickel electroplating when the resist is peeled off. In this embodiment, novolak-based positive resist was used.

In FIG. 6-3, nickel 21 was precipitated on the pattern formed in the step of FIG. 6-2, by nickel electroplating. In this embodiment, pure nickel was used as the material for electroplating. However, a material containing nickel with minor amounts of silver or copper may also be used.

In FIG. 7-4, the resist 7 formed in the step of FIG. 6-2 was peeled off. There is no restriction on the use of the peeling solution as long as the resist is dissolved in the peeling solution to be used without affecting the nickel electroplating. In this embodiment, an organic solvent (acetone or butyl acetate) was used.

In FIG. 7-5, the current supply layer 12 formed in the step of FIG. 6-1 was removed by etching. There are a range of etching solutions such as ferric chloride and alkaline solution, which etch the copper 14. In this embodiment, an alkaline etching solution was used. An etching time of over 10 seconds makes it difficult to control the operation, and is unfavorable from the viewpoint of practice. On the other hand, when the etching time is too long, for example, when the etching is performed for 5 minutes or more, the amount of side etching is increased, leading to long takt time. To avoid such problems, it is preferable to determine the etching solution and etching conditions by appropriate experiments. The following etching of the portion of the titanium 13 of the current supply layer was performed using an etching solution containing hydrogen peroxide as a main component. In both etchings, there is no restriction on the use of the etching solution as long as the nickel electroplating is not corroded by the etching solution to be used.

Method for Bonding Semiconductor Wafers

In this embodiment, when wafers are bonded, a displacement of the wafers is prevented to ensure bonding of bumps and pads of the wafers, by the following process. That is, an adhesive is applied between the wafers, and the patterns are optically detected to position the wafers temporarily. Then, positional confirmation is performed by a method such as x-rays capable of passing through the wafers. The positions of the wafers are adjusted based on the positional confirmation information. When the positions are determined, an adhesive is applied and hardened. The adhesive used here is preferably a light curing adhesive. The bumps and the pads are bonded together while the interlayer adhesive is hardened in a thermocompression step.

The bonding method shown in the step of FIG. 2-6 will be described in detail below with reference to FIGS. 8 to 10. Here, the bumps and the pads are not shown in order to illustrate the bonding method at wafer level. Also, the interposer 8 shown in FIG. 2-6 is omitted to focus on the bonding of two semiconductor wafers.

In FIG. 8-1, a wafer (wafer 22 referred to as the wafer 1) is mounted to a positioning jig 23. For example, the wafer is mounted by a known technology such as mechanical chuck.

In FIG. 8-2, the interlayer adhesive 6 is applied to a portion in which the next wafer of the wafer 1 is laminated. In this embodiment, it is preferable to control the amount of interlayer adhesive to the extent that the interlayer adhesive does not flow from the periphery of the wafers due to pressure in the bonding. The interlayer adhesive 6 used here is a thermosetting adhesive. Incidentally, the interlayer adhesive 6 can be applied to a surface of the wafer on which the pads are formed, or to a surface of the wafer on which the bumps are formed.

In FIG. 8-3, a wafer (wafer 24 referred to as the wafer 2) is mounted to a jig 26. The other wafer to be bonded is carried to the position above the jig 26, in which the patterns of the wafers are confirmed by an optical detector 25 to position the wafers. In other words, the surface of the wafer 1 on which the pads (or bumps) are formed and the surface of the wafer 2 on which the bumps (or pads) are formed, are disposed facing each other. Then, the positions of the wafers are adjusted by optical detection using the optical detector 25. The optical detector 25 is a device (for example, a binocular microscope) that optically detects the patterns of the upper and lower wafers. The optical detector 25 is used for detecting alignment marks provided in the wafers 1 and 2 by a known method, so that the wafers are positioned using the detected alignment marks. Incidentally, the optical detector 25 may also detect the patterns (for example, patterns of the pads and bumps) formed on the wafers, instead of the alignment marks, to perform the positioning using the detected patterns.

In FIG. 9-4, the wafers are caused to come into contact with each other through the interlayer adhesive. It is preferable that the step for causing the wafers to come into contact with each other through the interlayer adhesive 6, is performed in a vacuum to prevent bubbles from entering between the wafers when bonded. Thus, it is preferable that the entire positioning jigs are put into vacuum equipment to position the wafers in the step of FIG. 8-3, and then the wafers are caused to come into contact with each other through the interlayer adhesive 6 in the vacuum state. An uncured adhesive between the wafers functions as a lubricant, so that the wafers can be moved in the later step of positional adjustment. After the wafers have come into contact with each other through the interlayer adhesive 6, bubbles can no longer enter between the wafers when taken out from the vacuum equipment. Thus, the wafers can be handled in the atmosphere. Incidentally, when the wafers 1 and 2, having been positioned in the step of FIG. 8-3, are bonded by thermocompression in this state, displacement occurs. The bumps and the pads are displaced, resulting in a lower yield. The reason for the occurrence of displacement has not been clarified, but it is considered that the wafers slide each other due to uncured adhesive. Hence, the step of FIG. 9-5 and the following step are necessary.

In FIG. 9-5, the positions of the wafers 1 and 2 are confirmed. Because the wafers are not optically transmissive, an x-ray generator 41 is provided on the upper side of the wafers and an x-ray detector (for example, an x-ray imaging apparatus) 42 is provided on the lower side thereof, to detect the alignment marks for x-ray detection (not shown in the figures) formed on the wafers 1 and 2. In this way, the positions of the wafers are confirmed. The alignment mark for x-ray detection is formed by non x-ray transmissive material (for example, a metal). For example, the alignment mark can be formed by nickel, at the same time of forming the nickel 21 in the process for forming bump(s) shown in FIGS. 4 to 5 and in the process for forming pad(s) shown in FIGS. 6 to 7. It is also possible to detect the bumps and the pads by x-rays, instead of detecting the alignment marks for x-ray detection. Incidentally, portions of the jigs 23, 26 through which x-rays pass, are made transmissive to x-rays. For example, the portions of the alignment marks are formed by an x-ray transmissive material.

In FIG. 9-6, the positions of the wafers 1 and 2 are adjusted based on the positioning information. For example, the positions of the wafers are adjusted to match the images, namely, the alignment mark for x-ray detection of the wafer 1 and the alignment mark for x-ray detection of the wafer 2 that are detected by the x-ray detector (for example, x-ray imaging apparatus) 42.

In FIG. 10-7, an adhesive 27 is applied to the periphery of the wafers 1 and 2, and then the adhesive 27 is hardened. As shown in the figure, the adhesive 27 can be applied only to portions of the periphery of the wafers, but may be applied entirely around the periphery of the wafers. In this embodiment, it is preferable to use light curing adhesive as the adhesive 27 for simplifying the process. Use of the light curing adhesive 27 makes it possible to harden the light curing adhesive 27 by light, without hardening the interlayer adhesive 6 which is the thermosetting adhesive.

In FIG. 10-8, pressure is applied to the wafers 1 and 2 at a temperature of higher than the melting point of the bump. At this time, the interlayer adhesive 6 on the bumps 5 are pushed away, so that the bumps 5 are coupled to the pads 20. The viscosity of the interlayer adhesive 6, which is the thermosetting adhesive, once decreases by heating, so that the interlayer adhesive 6 on the bumps 5 are pushed away. The bumps 5 are melted by further heating, so that bumps 5 and the pad 20 are electrically coupled to each other. The interlayer adhesive 6 is hardened by still further heating, and thus a laminated structure of the wafers 1 and 2 is formed.

In FIG. 10-9, the laminated structure of the wafers 1 and 2 is removed from the jigs.

The desired number of wafers can be laminated by repeating the steps of FIG. 8-1 to FIG. 10-9, using the laminated structure of the wafers 1 and 2 shown in FIG. 10-9 fabricated as described above, as the wafer 1 (22) of FIG. 8-1. Similarly, with respect to the bonding of the wafer and the interposer 8 shown in FIG. 2-4, the steps of FIG. 8-1 to FIG. 10-9 are performed using the interposer 8 instead of the wafer 1 (22) of FIG. 8-1. Further, the desired number of wafers can be laminated over the interposer 8 by repeating the steps of FIG. 8-1 to FIG. 10-9, using the laminated structure of interposer and wafer fabricated as described above, as the wafer 1 (22) of FIG. 8-1.

Arrangement of Alignment Mark(s) for X-Ray Detection

In the steps of positional confirmation and positional adjustment by x-rays shown in FIGS. 9-5 and 9-6, the x-rays pass through all the wafers to be laminated. When three or more wafers are laminated with an alignment mark placed at the same position in each of the wafers, the alignment mark of each wafer overlap one another. In this embodiment, as shown in FIG. 11, the alignment marks for x-ray detection are arranged at a distance from each other. FIG. 11 shows a portion of a laminated structure in which a first wafer 51, second wager 52, third wafer 53, and fourth wafer 54 are laminated over the interposer 8. There are formed an alignment mark 61 on wafer 51, alignment marks 62 and 63 on the wafer 52, alignment marks 64 and 65 on the wafer 53, and an alignment mark 66 on the wafer 54, respectively. The alignment marks 61 and 62 are used for the positional adjustment of the first wafer 51 and the second wafer 52. The alignment marks 63 and 64 are used for the positional adjustment of the second wafer 52 and the third wafer 53. The alignment marks 65 and 66 are used for the positional adjustment of the third wafer 53 and the forth wafer 54. In other words, for example, the alignment mark 62 for adjusting the position relative to the wafer 51 adjacent to a surface of the wafer 52, and the alignment mark 63 for adjusting the position relative to the wafer 53 adjacent to the other surface of the wafer 52, are placed at different positions in the wafer 52. In this way, it is possible to perform the positional adjustment by x-rays with high accuracy. Incidentally, the alignment marks for x-ray detection may be used together with the alignment marks for positional adjustment by the optical detection in the step of FIG. 8-3. Further, the shape of the alignment marks may be that of commonly used alignment marks.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. A bonding method of semiconductor substrates to perform three-dimensional mounting by coupling a first semiconductor substrate in which pads are formed, to a second semiconductor substrate in which bumps are formed, through an interlayer adhesive, the method comprising the steps of:

first causing a surface of the first semiconductor substrate on which the pads are formed, and a surface of the second semiconductor substrate on which the bumps are formed, to come into contact with each other through the interlayer adhesive;

second adjusting the positions of the first and second semiconductor substrates coming into contact with each other through the interlayer adhesive;

third applying an adhesive to the periphery of the first and second semiconductor substrates whose positions have been adjusted in the second step, and hardening the adhesive applied to the periphery thereof; and fourth electrically coupling the pads and the bumps while hardening the interlayer adhesive, by heating and pressing the first and second semiconductor substrates having been subjected to the step 3.

2. The bonding method of semiconductor substrates according to claim 1, wherein the first and second semiconductor substrates are semiconductor wafers.

3. The bonding method of semiconductor substrates according to claim 1, wherein the first and second semiconductor substrates are semiconductor substrates having a plurality of areas for chips.

4. The bonding method of semiconductor substrates according to claim 1, wherein the interlayer adhesive is a thermosetting adhesive, and the adhesive to be applied to the periphery of the first and the second semiconductor substrates, is a light curing adhesive.

5. The bonding method of semiconductor substrates according to claim 1, wherein the first step is performed in a vacuum.

6. The bonding method of semiconductor substrates according to claim 1, wherein the first step further includes adjusting the positions of the first and second semiconductor substrates by optical detection, to cause the first and second semiconductor substrates to come into contact with each other through the interlayer adhesive, and wherein the second step further includes adjusting the positions of the first and second semiconductor substrates by x-ray detection, to adjust the positions of the first and second semiconductor substrates.

7. The bonding method of semiconductor substrates according to claim 6, wherein, the second step uses alignment marks for x-ray detection, the alignment marks being arranged separately on a semiconductor substrate so that one alignment mark for adjusting the position relative to a semiconductor substrate adjacent to a surface of the specific semiconductor substrate, and the other alignment mark for adjusting the position relative to a semiconductor substrate adjacent to the other surface of the specific semiconductor substrate, are placed at different positions.

8. The bonding method of semiconductor substrates according to claim 1, the method further comprising the step of using an interposer, instead of one of the first and second semiconductor substrates, to bond the interposer and a semiconductor substrate together.

9. The bonding method of semiconductor substrates according to claim 1, the method further comprising the step of using a laminated structure formed by bonding a plurality of semiconductor substrates, or using a laminated structure formed by bonding an interposer and a semiconductor substrate, instead of one of the first and second semiconductor substrates, to bond a semiconductor substrate to one of the laminated structures.

10. A laminated structure fabricated by the bonding method of semiconductor substrates according to claim 1.

* * * * *